US012765307B2

(12) United States Patent
Rhim et al.

(10) Patent No.: US 12,765,307 B2
(45) Date of Patent: Oct. 13, 2026

(54) STAMP DONOR PLATE AND METHOD FOR MANUFACTURING DISPLAY DEVICE USING THE SAME

(71) Applicant: LG DISPLAY CO., LTD., Seoul (KR)

(72) Inventors: Jusang Rhim, Seoul (KR); Yuseop Shin, Bucheon-si (KR); Dongseok Lee, Bucheon-si (KR); Sunghwan Yoon, Seoul (KR); Minjae Kang, Seoul (KR); Rokhee Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 213 days.

(21) Appl. No.: 18/426,456

(22) Filed: Jan. 30, 2024

(65) Prior Publication Data

US 2024/0258135 A1 Aug. 1, 2024

(30) Foreign Application Priority Data

Jan. 31, 2023 (KR) ........................ 10-2023-0013144

(51) Int. Cl.
*H10P 72/00* (2026.01)
*H10W 90/00* (2026.01)

(52) U.S. Cl.
CPC ......... *H10P 72/0446* (2026.01); *H10W 90/00* (2026.01)

(58) Field of Classification Search
CPC ..... H01L 2224/7555; H01L 2224/7755; H01L 2224/7855; H01L 2224/79601; H01L 2224/80047; H01L 21/67754; H01L 21/67757; H01L 2221/68363; H01L 2221/68368; H01L 2221/67; H01L 21/67; H01L 21/67721; H01L 21/70; H10P 72/74; H10P 72/7432; H10P 72/7434; H10P 90/21; H10P 90/22; H10P 90/24
See application file for complete search history.

(56) References Cited

U.S. PATENT DOCUMENTS

| | | | | |
|---|---|---|---|---|
| 8,506,867 | B2 | 8/2013 | Menard | |
| 2010/0123268 | A1* | 5/2010 | Menard | H10P 72/74 264/293 |
| 2014/0130691 | A1* | 5/2014 | Yang | B41N 6/00 101/382.1 |
| 2017/0047306 | A1 | 2/2017 | Meitl et al. | |
| 2018/0040501 | A1* | 2/2018 | Lerner | B81C 99/002 |
| 2023/0238473 | A1* | 7/2023 | Wang | H10H 20/01 438/29 |
| 2024/0030382 | A1* | 1/2024 | An | H10H 20/819 |
| 2024/0258265 | A1* | 8/2024 | Kang | H10P 72/0436 |

FOREIGN PATENT DOCUMENTS

| | | | | |
|---|---|---|---|---|
| KR | 10-2011-0118616 A | 10/2011 | | |
| KR | 10-2020-0007205 A | 1/2020 | | |
| KR | 20210051039 A * | 5/2021 | | H01L 25/0753 |

* cited by examiner

*Primary Examiner* — Andrew L Swanson
(74) *Attorney, Agent, or Firm* — Fish & Richardson P.C.

(57) ABSTRACT

A stamp donor plate includes a stamp donor plate substrate including an inner area and an outer area surrounding the inner area; and a stamp structure disposed on the stamp donor plate substrate, wherein the stamp structure includes a plurality of protrusions, wherein the plurality of protrusions include a plurality of first protrusions arranged on an inner area, and a plurality of second protrusions arranged on the outer area.

13 Claims, 9 Drawing Sheets

STAMP DONOR PLATE AND METHOD FOR MANUFACTURING DISPLAY DEVICE USING THE SAME

CROSS-REFERENCE TO RELATED APPLICATION

This application claims the priority of Korean Patent Application No. 10-2023-0013144 filed on Jan. 31, 2023, which is hereby incorporated by reference in its entirety.

BACKGROUND

Field of the Disclosure

The present disclosure relates to a micro-LED, and more specifically, to a stamp donor plate and a method for manufacturing a display device using the same.

Description of the Background

A display device is applied to various electronic devices such as TVs, mobile phones, laptops, and tablets. To this end, research to develop thinning, lightening, and low power consumption of the display device is continuing.

Among display devices, a light-emitting display device has a light-emitting element or a light source built therein and displays information using light generated from the built-in light-emitting element or light source. A display device including a self-light-emitting element may be implemented to be thinner than a display device with the built-in light source, and may be implemented as a flexible display device that may be folded, bent, or rolled.

The display device having the self-light-emitting element may include, for example, an organic light-emitting display device (OLED) including a light-emitting layer made of an organic material, or a micro-LED display device (micro light-emitting diode display device) including a light-emitting layer made of an inorganic material. In this regard, the organic light-emitting display device does not require a separate light source. However, due to material characteristics of the organic material that is vulnerable to moisture and oxygen, a defective pixel easily occurs in the organic light-emitting display device due to an external environment. On the contrary, the micro-LED display device includes the light-emitting layer made of the inorganic material that is resistant to moisture and oxygen and thus is not affected by the external environment and thus has high reliability and has a long lifespan compared to the organic light-emitting display device.

Furthermore, the micro-LED display device may implement a flexible display device while having a thinner structure than that of the organic light-emitting display device. Accordingly, a plurality of micro-LED display devices may be arranged to implement a large-arca display device. This is an advantage over an organic light-emitting display device.

Transfer technology is a process that transfers micro-LED chips grown on a growth substrate onto a panel substrate. As a size of micro-LED chips becomes smaller, research is being conducted on technology to transfer the micro-LED chips onto a panel substrate at high precision.

SUMMARY

The present disclosure is to provide a stamp structure used to transfer the micro-LED chip grown on the growth substrate onto the panel substrate.

More specifically, the present disclosure is to provide a stamp structure used to transfer the micro-LED chip onto a target location of the panel substrate, wherein the micro-LED chip is accurately transferred to the stamp structure and then the stamp structure transfers the micro-LED chip to the panel substrate.

The present disclosure is also to provide a method for manufacturing a display device in which the micro-LED chip is accurately transferred to the stamp structure, and then the stamp structure transfers the micro-LED chip to the panel substrate.

The present disclosure is not limited to the above-mentioned. Other features and advantages according to the present disclosure that are not mentioned may be understood based on following descriptions, and may be more clearly understood based on aspects according to the present disclosure. Further, it will be easily understood that the features and advantages according to the present disclosure may be realized using means shown in the claims or combinations thereof.

To achieve these and other advantages and in accordance with the present disclosure, as embodied and broadly described, a first aspect of the present disclosure provides a stamp donor plate comprising: a stamp donor plate substrate including an inner area and an outer arca surrounding the inner area; and a stamp structure disposed on the stamp donor plate substrate, wherein the stamp structure includes a plurality of protrusions, wherein the plurality of protrusions include a plurality of first protrusions arranged on an inner arca, and a plurality of second protrusions arranged on the outer area.

In one implementation, each of the plurality of protrusions has a first surface in contact with the stamp donor plate substrate and a second surface opposite to the first surface, wherein a width of the second surface is larger than a width of the first surface, wherein the second surfaces of the protrusions adjacent to each other contact each other at a boundary therebetween.

In one implementation, lower surfaces of the plurality of first protrusions of the stamp structure constitute one flat surface.

In one implementation, each of the first protrusion and the second protrusion has a trapezoidal cross-section.

In one implementation, the stamp donor plate further comprises a first air flow passage defined between adjacent ones of the plurality of first protrusions, and a second air flow passage defined between adjacent ones of the plurality of second protrusions.

In one implementation, the first air flow passage and the second air flow passage have different widths, wherein the second air flow passage has a relatively larger width than a width of the first air flow passage.

In one implementation, each of the plurality of protrusions includes a first surface in contact with the stamp donor plate substrate and a second surface opposite the first surface, wherein the stamp donor plate includes an air flow lane defined on the second surface.

In one implementation, the air flow lane has a V-shaped groove extending along one direction of the stamp donor plate substrate.

In one implementation, the air flow lane has a width smaller than a width of the light-emitting element.

In another aspect of the present disclosure, a method for manufacturing a display device includes preparing a panel substrate including an adhesive layer; providing a stamp donor plate comprising: a stamp donor plate substrate including an inner area and an outer area surrounding the inner area; and a stamp structure disposed on the stamp donor plate substrate, wherein the stamp structure includes a plurality of protrusions, wherein the plurality of protrusions include a plurality of first protrusions arranged on an inner area, and a plurality of second protrusions arranged on the outer area; arranging a plurality of light-emitting elements on the stamp donor plate; positioning the stamp donor plate having the plurality of light-emitting elements arranged thereon on the panel substrate; moving the stamp donor plate toward the panel substrate and bonding the light-emitting elements onto the adhesive layer of the panel substrate; and detaching the stamp donor plate from the panel substrate.

In one implementation of the method, detaching the stamp donor plate from the panel substrate includes placing a detachment mechanism on each of both opposing edges of the stamp donor plate; and detaching the stamp donor plate from the panel substrate using the detachment mechanism such that detachment starts at one side of the stamp donor plate connected to the detachment mechanism located at a detachment start point and proceeds sequentially toward the other side of the stamp donor plate connected to the detachment mechanism located at a detachment end point.

In one implementation of the method, the stamp donor plate further includes a first air flow passage defined between adjacent ones of the plurality of first protrusions, and a second air flow passage defined between adjacent ones of the plurality of second protrusions.

In one implementation of the method, air inflow into the second air flow passage disposed in the outer area of the stamp donor plate substrate is greater than air inflow into the first air flow passage disposed in the inner area, such that the detachment starts first in the outer area of the stamp donor plate substrate.

According to one aspect of the present disclosure, the stamp donor plate includes the stamp structure including the plurality of protrusions, such that the light-emitting elements may be smoothly detached from the stamp donor plate without defects.

Furthermore, the width of the air flow passage defined between the protrusions disposed in the inner area and the width of the air flow passage defined between the protrusions disposed in the outer area may be different from each other, such that the light-emitting elements may be easily detached from the stamp donor plate.

Furthermore, the air flow passages defined between the plurality of protrusions of the stamp donor plate may be different from each other such that the contact area between the surface of the stamp structure and the panel substrate may be minimized to prevent defects from occurring during light-emitting element transfer.

Furthermore, lower surfaces of the plurality of first protrusions of the stamp structure constitute one flat surface, thereby reducing production energy via a process optimization that the plurality of light-emitting elements may be transferred using the flat surface.

Furthermore, lower surfaces of the plurality of first protrusions of the stamp structure constitute one flat surface. Accordingly, the pitch between adjacent ones of the light-emitting elements that may be transferred to the panel substrate using the stamp donor plate substrate may be reduced, thereby realizing a display device with high resolution.

Effects of the present disclosure are not limited to the effects mentioned above, and other effects not mentioned will be clearly understood by those skilled in the art from the descriptions below.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
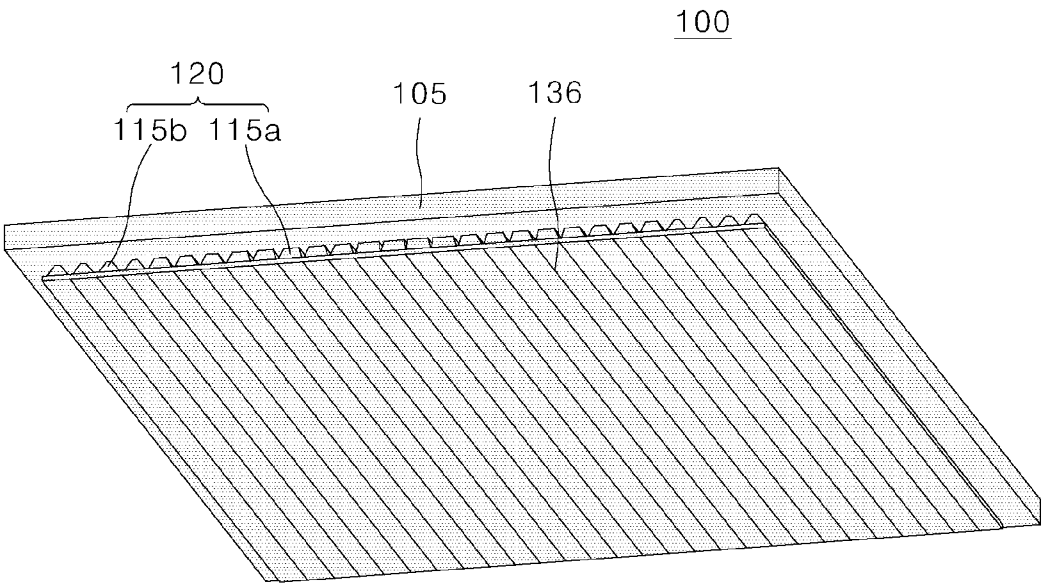
FIG. 1 is a perspective view showing a stamp donor plate according to an aspect of the present disclosure.

Advantages and features of the present disclosure, and a method of achieving the advantages and features will become apparent with reference to aspects described later in detail together with the accompanying drawings. However, the present disclosure is not limited to the aspects as disclosed under, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating aspects of the present disclosure are illustrative, and the present disclosure is not limited thereto.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is indicated.

When a certain aspect may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "aspects," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating aspects.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display device according to each aspect of the present disclosure will be described with reference to the accompanying drawings.

Figure 2:
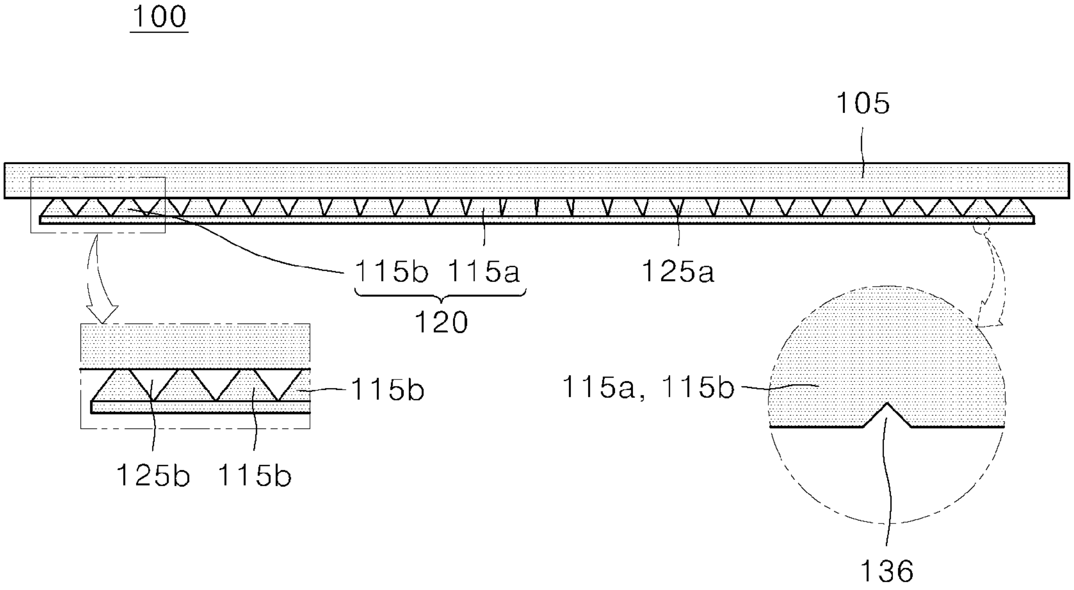
FIG. 2 is a cross-sectional view showing a stamp donor plate according to an aspect of the present disclosure.
Figure 3:
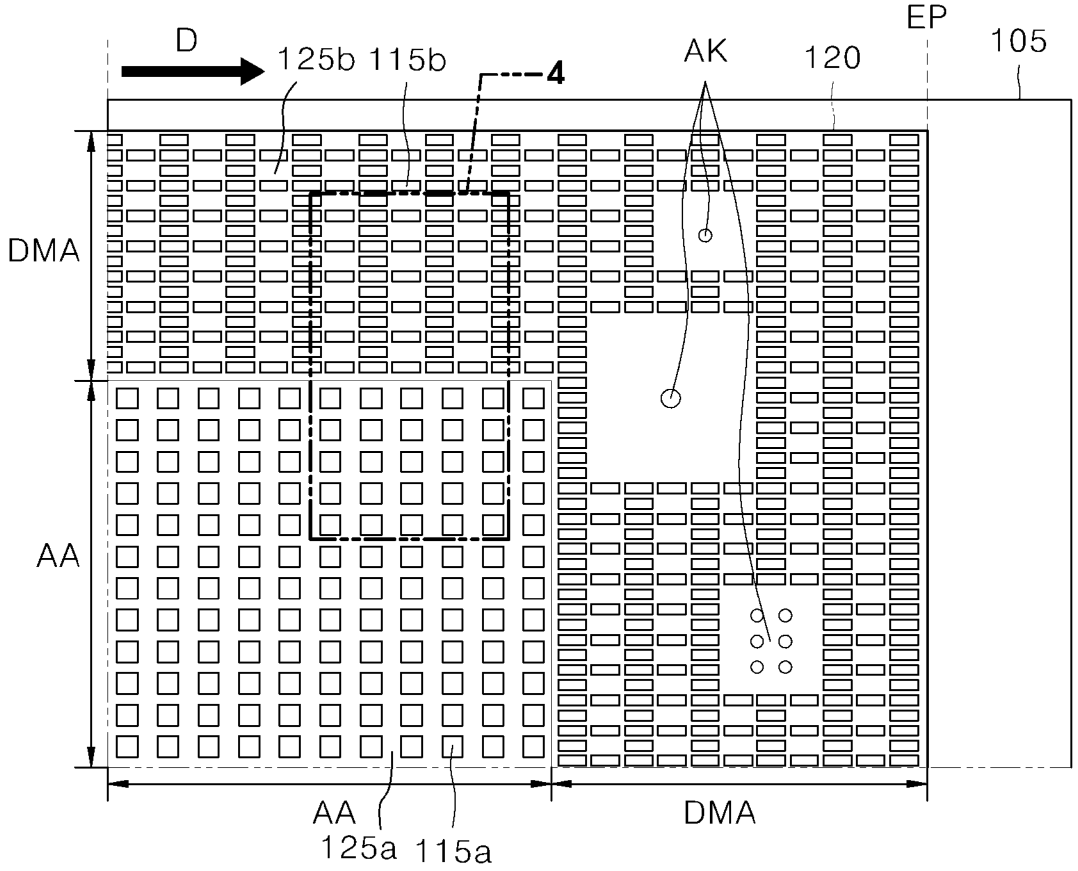
FIG. 3 and FIG. 4 are diagrams for illustrating a plurality of protrusions that constitute a stamp structure according to an aspect of the present disclosure.
Figure 4:
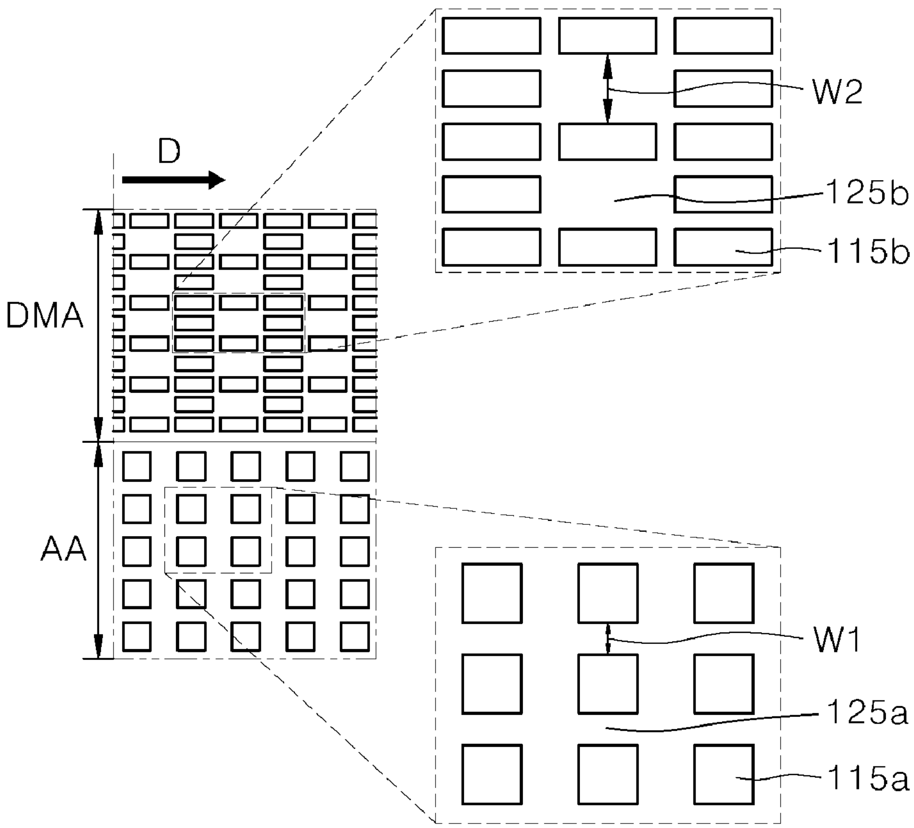

FIG. 1 is a perspective view showing a stamp donor plate according to an aspect of the present disclosure. FIG. 2 is a cross-sectional view showing a stamp donor plate according to an aspect of the present disclosure. FIG. 3 and FIG. 4 are diagrams for illustrating a plurality of protrusions that constitute a stamp structure for transfer according to an aspect of the present disclosure.

Referring to FIGS. 1 to 4, a stamp donor plate 100 according to an aspect of the present disclosure may include a stamp donor plate substrate 105 and a stamp structure 120 disposed on the stamp donor plate substrate 105. The stamp structure 120 may be configured to include a plurality of protrusions 115*a* and 115*b*. The stamp donor plate substrate 105 may include polycarbonate (PC) material. The plurality of protrusions 115*a* and 115*b* may include polydimethylsiloxane (PDMS) as a silicon-based material with excellent elasticity and resilience. The stamp donor plate substrate 105 may include an inner area AA and an outer area DMA surrounding the inner area AA. A plurality of alignment keys AK may be disposed in the outer area DMA of the stamp donor plate substrate 105 to align positions with each other during a transfer process.

Each of the plurality of protrusions 115*a* and 115*b* may have one surface adhered to the stamp donor plate substrate 105 using PSA (pressure sensitive adhesive) and the other surface opposite thereto adhered to a light-emitting element using PSA.

The plurality of protrusions 115*a* and 115*b* may be arranged along longitudinal and transversal directions of the stamp donor plate substrate 105. The plurality of protrusions 115*a* and 115*b* may include the first protrusions 115*a* disposed in the inner area AA of the stamp donor plate substrate 105, and having a first shape, and the second protrusions 115*b* disposed in the outer area DMA of the stamp donor plate substrate 105 and having a second shape. For example, the plurality of protrusions 115*a* and 115*b* may have a trapezoidal shape in a cross-sectional view. Each of the plurality of protrusions 115*a* and 115*b* may have an upper surface in contact with the stamp donor plate substrate 105 and a lower surface opposite thereto, wherein the upper surface has a smaller width than that of the lower surface. Accordingly, the lower surfaces of adjacent ones of the plurality of protrusions 115*a* and 115*b* may contact each other while there is no spacing therebetween. As a result, in a bottom view, the stamp structure 120 may have a flat surface shape.

A resolution may be determined based on a pitch between adjacent ones of light-emitting elements. The smaller the pitch, the higher the resolution. In this regard, the lower surfaces of adjacent ones of the plurality of protrusions 115*a* and 115*b* of the stamp donor plate substrate 105 according to the aspect of the present disclosure may contact each other while there is no spacing therebetween. In a bottom view, the stamp structure 120 may have a flat surface shape. Accordingly, the pitch between the light-emitting elements that may be transferred to the stamp donor plate substrate 105 may be reduced, making it possible to implement a display device with high resolution.

A width of the upper surface of the first protrusion 115*a* having the first shape in contact with the stamp donor plate substrate 105 may be relatively larger than a width of the upper surface of the second protrusion 115*b* having the second shape in contact with the stamp donor plate substrate 105.

The lower surfaces of neighboring ones of the protrusions 115*a* and 115*b* may contact each other while there is no spacing therebetween. Accordingly, each of a plurality of air flow passages 125*a* and 125*b* may be defined between neighboring ones of the protrusions 115*a* and 115*b*. The air flow passages 125*a* and 125*b* may include the first air flow passage 125*a* disposed in the inner area AA of the stamp donor plate substrate 105 and disposed between adjacent ones of the first protrusions 115*a* having the first shape, and the second air flow passage 125*b* disposed in the outer area DMA of the donor plate substrate 105 and between adjacent ones of the second protrusions 115*b* having the second shape. The first air flow passage 125*a* and the second air flow passage 125*b* may have different widths W1 and W2. In another aspect, the cross-sectional area of the first air flow passage 125*a* may be different from that of the second air flow passage 125*b*.

For example, referring to FIG. 4, the second width W2 of the second air flow passage 125*b* may have a relatively larger width than the first width W1 of the first air flow passage 125*a*. In another aspect, the cross-sectional area of the first air flow passage 125*a* may be larger than that of the second air flow passage 125*b*. Accordingly, in a detachment process of the transfer process, air inflow into the second air flow passages 125*b* arranged in the outer area DMA of the stamp donor plate substrate 105 may be larger than air inflow into the first air flow passages 125*a* arranged in the inner area AA, such that detachment may occur first in the outer area DMA of the stamp donor plate substrate 105. As a result, uniform pressure may be secured in both the inner arca AA and the outer area DMA during a process of sequential detachment in an order from the outer area DMA to the inner area AA of the stamp donor plate 100. As the detachment process may be performed while ensuring uniform pressure, tilt defects or flip defects may be prevented from occurring when the light-emitting element is transferred, thereby improving process reliability.

Furthermore, a width between the first protrusion 115*a* and the second protrusion 115*b* at a boundary between the inner area AA and the outer area DMA of the stamp donor plate 100 may have a value between a width between the first protrusions 115*b* adjacent to each other and a width between the second protrusions 115*b* adjacent to each other. Furthermore, the width between the protrusions may increase as the stamp donor plate 100 extends in a direction from the inner area AA of the stamp donor plate 100 to the outer area DMA thereof. Accordingly, a width of each of the air flow passages 125*a* and 125*b* may increase as the stamp donor plate 100 extends in a direction from the inner area AA of the stamp donor plate 100 to the outer area DMA thereof.

An air flow lane 136 may be disposed in the lower surface of each of the plurality of protrusions 115*a* and 115*b*. The air flow lane 136 may have a V-shaped groove extending along one direction of the stamp donor plate substrate 105. The air flow lane 136 may have a width smaller than a size of the light-emitting element. The air flow lane 136 may extend in a direction parallel to a detachment direction. Accordingly, the air flow lane 136 may ensure a uniform air flow during the detachment process, thereby reducing the transfer defect of the light-emitting element.

Hereinafter, a method for transferring a light-emitting element onto a panel substrate using the stamp donor plate according to an aspect of the present disclosure will be described.

FIGS. 5 to 13 are diagrams for illustrating a method for manufacturing a display device using a stamp donor plate according to an aspect of the present disclosure.

Figure 5:
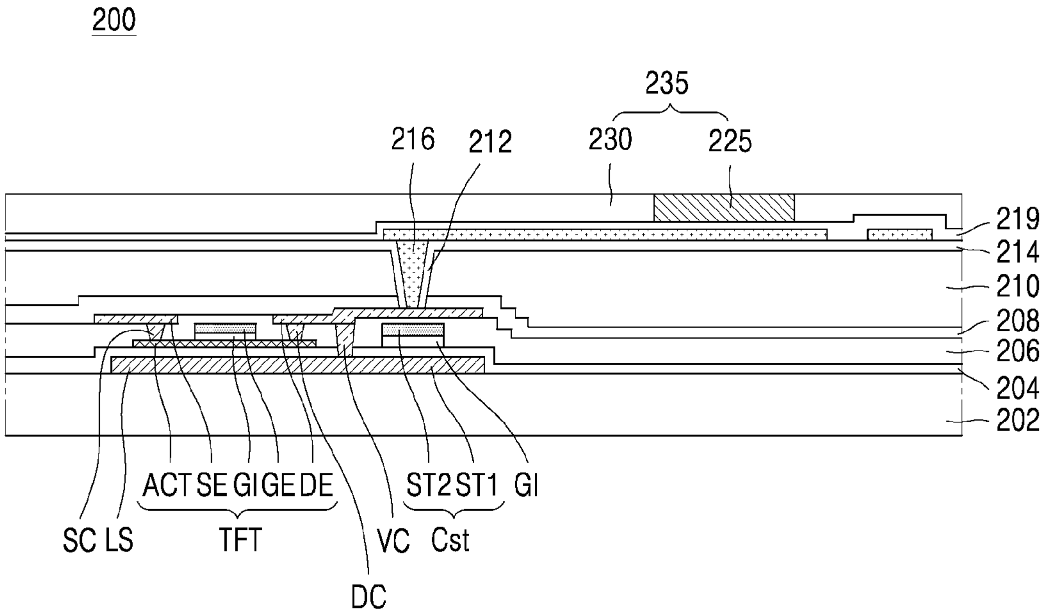
FIGS. 5 to 13 are diagrams for illustrating a method for manufacturing a display device using a stamp donor plate according to an aspect of the present disclosure.

Referring to FIG. 5, a panel substrate 200 including underlying circuit elements such as thin film transistors TFTs is prepared.

A light blocking layer LS may be disposed on a base substrate 202 of the panel substrate 200. The light blocking layer LS may reduce leakage current by preventing light incident from a position under the base substrate 202 from being incident to active layers of the plurality of thin film transistors. For example, the light blocking layer LS may be disposed under the active layer ACT of the thin film transistor TFT functioning as a driving transistor to prevent the light from being incident on the active layer ACT.

A buffer layer 204 is disposed on the light blocking layer LS. The buffer layer 204 may block impurities or moisture invading through the base substrate 202. The buffer layer 204 may include an insulating material such as silicon oxide (SiOx) and silicon nitride (SiNx).

The thin film transistor TFT is disposed on the buffer layer 204. The thin film transistor TFT may include a semiconductor layer ACT, a gate electrode GE, a source electrode SE, and a drain electrode DE. A gate insulating layer GI may be disposed between the semiconductor layer ACT and the gate electrode GE.

The semiconductor layer ACT may include an active area that overlaps the gate electrode GE and constitutes a channel, and a source area and a drain area respectively located on both opposing sides of the active area. A first interlayer insulating film 206 is disposed on the gate electrode GE. The first interlayer insulating film 206 may include a source contact SC and a drain contact DC. The source contact SC and the drain contact DC may partially expose the surfaces of the source area and the drain area of the semiconductor layer ACT, respectively. The source contact SC and the drain contact DC may be located on the first interlayer insulating film 206, and the source electrode SE and the drain electrode DE may be electrically connected to the source/drain areas of the semiconductor layer ACT, respectively.

A storage capacitor Cst may include a first capacitor electrode ST1 and a second capacitor electrode ST2. The first capacitor electrode ST1 may be disposed between the substrate 102 and the buffer layer 104. The first capacitor electrode ST1 may be formed integrally with the light blocking layer LS. The buffer layer 104 and the gate insulating layer GI may act as a dielectric on the first capacitor electrode ST1. The second capacitor electrode ST2 may be disposed on the gate insulating layer GI. The second capacitor electrode ST2 may be made of the same material as that of the gate electrode GE.

A first passivation layer 208 is disposed on the source electrode SE and the drain electrode DE. The first passivation layer 208 serves to protect the thin film transistor TFT and may include an insulating material. A first planarization layer 210 is disposed on the first passivation layer 208. The first planarization layer 210 serves to planarize a surface step as caused by an underlying circuit element such as the thin film transistor TFT. The first planarization layer 210 may be configured to include a photoactive compound (PAC), but is not limited thereto.

The first planarization layer 210 may include a contact hole 212 exposing a portion of the surface of the drain electrode DE. A second interlayer insulating film 214 may be disposed on a side surface of the contact hole 212 and the first planarization layer 210. A via contact 216 may fill the contact hole 212. The drain electrode DE connected via one surface of the via contact 216 may be electrically connected to the light blocking layer LS via a through-electrode VC that extends through the first interlayer insulating film 206 and the buffer layer 204.

A reflective electrode RF may be disposed on the via contact 216 and the second interlayer insulating film 214. The reflective electrode RF reflects light emitted from the light-emitting element toward the panel substrate 200 to be emitted out of a display area. The reflective electrode RF may include a highly reflective metal material. For example, the metal material with high reflectivity may include a single-layer structure or a stack structure made of aluminum (Al), copper (Cu), silver (Ag), molybdenum (Mo), gold (Au), magnesium (Mg), calcium (Ca), or barium (Ba), or an alloy of at least two thereof. One surface of the reflective electrode RF may contact the via contact 216 to be electrically connected to the drain electrode DE.

A signal line 218 may be coplanar with the reflective electrode RF. The signal line 218 may include a plurality of signal lines. The plurality of signal lines may include a high potential voltage line VDDL, a low potential voltage line VSSL, a reference voltage line RL, a data line DL, and a scan line SL. A second passivation layer 219 may be disposed to cover the reflective electrode RF.

An adhesive layer 235 may be disposed on the second passivation layer 219. The adhesive layer 235 may include a first adhesive pattern 225 and a second adhesive pattern 230. The first adhesive patterns 225 and the second adhesive patterns 230 may be arranged alternately with each other. However, the present disclosure is not limited thereto. The first adhesive pattern 225 may include a material having relatively stronger adhesiveness than that of the second adhesive pattern 230. Accordingly, the light-emitting elements may then be fixed and positioned onto the first adhesive pattern 225.

Figure 6:
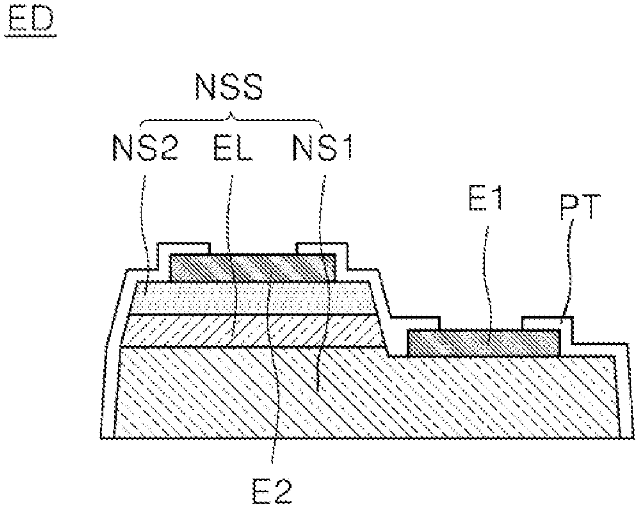

Referring to FIG. 6, a plurality of light-emitting elements ED to be transferred to the panel substrate 200 are prepared.

The light-emitting element ED may include a nitride semiconductor structure NSS, a first electrode E1, and a second electrode E2. The nitride semiconductor structure NSS may include a first semiconductor layer NS1, an active layer EL disposed on one side of an upper surface of the first semiconductor layer NS1, and a second semiconductor layer NS2. The first electrode E1 is disposed on the other side of the upper surface of the first semiconductor layer NS1 where the active layer EL is not located. The second electrode E2 is disposed on the second semiconductor layer NS2. A protective layer pattern PT may cover a portion of an outer surface of the light-emitting element ED. In one aspect of the present disclosure, an example in which the light-emitting element ED has a lateral structure is described. However, the present disclosure is not limited thereto. For example, the light-emitting element ED may have a vertical structure.

The first semiconductor layer NS1 is a layer for supplying electrons to the active layer EL and may include a nitride semiconductor containing a first conductivity impurity. For example, the first conductivity impurity may include N-type impurity. The active layer EL disposed on one side of the upper surface of the first semiconductor layer NW1 may include a multi quantum well (MQW) structure. The second semiconductor layer NS2 is a layer for injecting holes into the active layer EL. The second semiconductor layer NS2 may include a nitride semiconductor containing a second conductivity impurity. For example, the second conductivity impurity may include P-type impurity.

Next, the plurality of light-emitting elements are self-aligned on a self-assembly donor plate 300.

Figure 7:
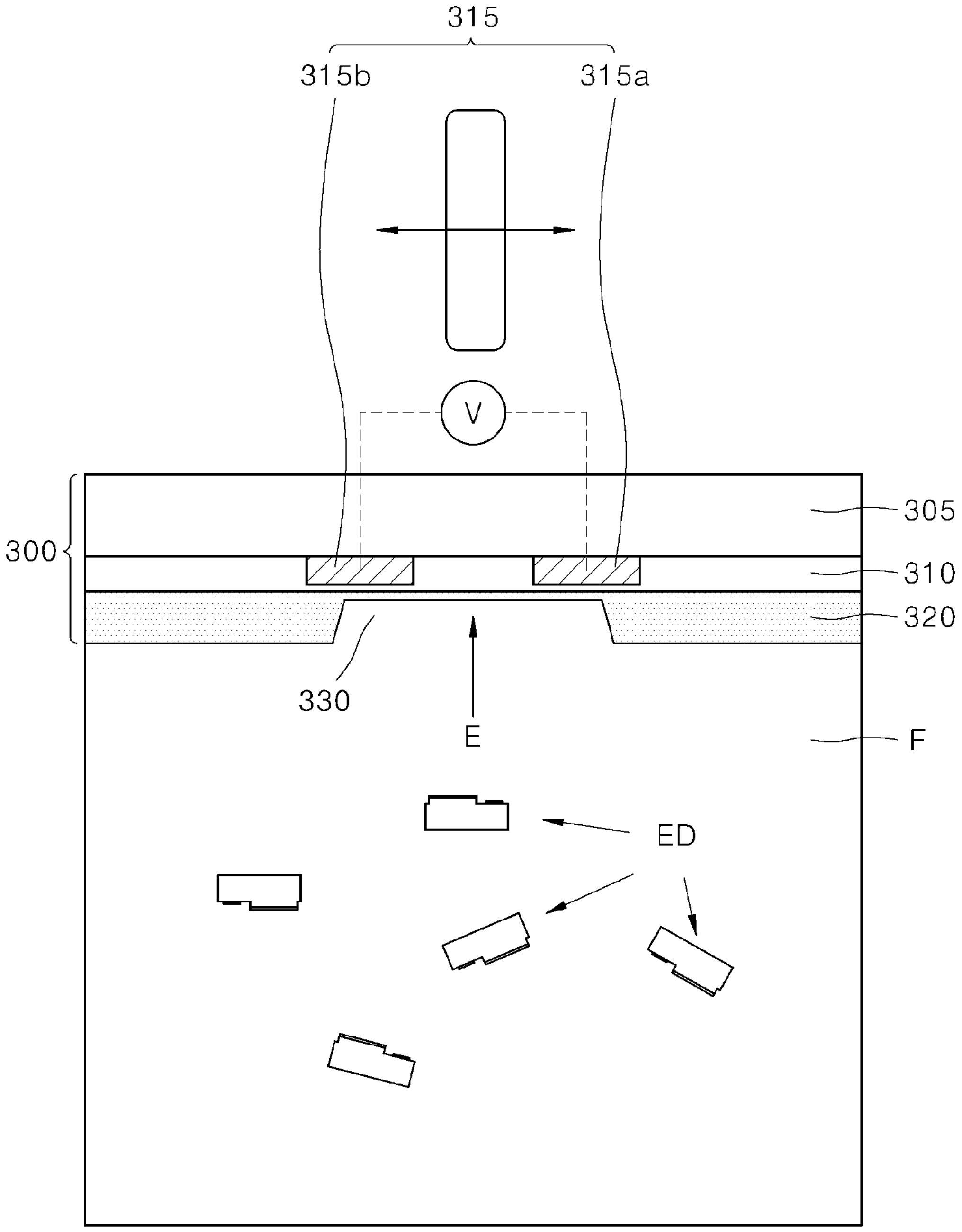

For example, referring to FIG. 7, a self-assembly donor plate 300 having a plurality of assembly grooves 330 is put into a self-assembly chamber filled with fluid F in which the plurality of light-emitting elements ED are dispersed. The light-emitting element ED may be configured to include a magnetic material. A direction in which the self-assembly donor plate 300 is put into the self-assembly chamber may be a direction where the assembly groove 330 contacts and faces the fluid F. In the self-assembly donor plate 300, a pair of assembly electrodes 315*a* and 315*b* may be respectively disposed on both opposing sides of the assembly groove 330. The assembly electrodes 315*a* and 315*b* generate an electric field E when a voltage V is applied thereto. The electric field E may serve to attract the light-emitting element ED toward the assembly groove 330, as indicated by an arrow.

A magnet M is disposed on the other surface opposite to one surface of the self-assembly donor plate 300 on which the assembly electrodes 315*a* and 315*b* are placed. The voltage is applied to the assembly electrodes 315*a* and 315*b* while the magnet M moves in translation. Thus, one light-emitting element ED among the plurality of light-emitting elements dispersed in the fluid F is aligned into the assembly groove 330. Using this dielectrophoresis, each of the plurality of light-emitting elements ED dispersed in the fluid Fis aligned into each of the plurality of assembly grooves 330 of the self-assembly donor plate 300.

In one example, in accordance with the present disclosure, an example in which the light-emitting element ED is disposed on the self-assembly donor plate 300 is described. However, the present disclosure is not limited thereto. For example, a subsequent first transfer process may be performed while the light-emitting element is disposed on a growth substrate.

Figure 8:
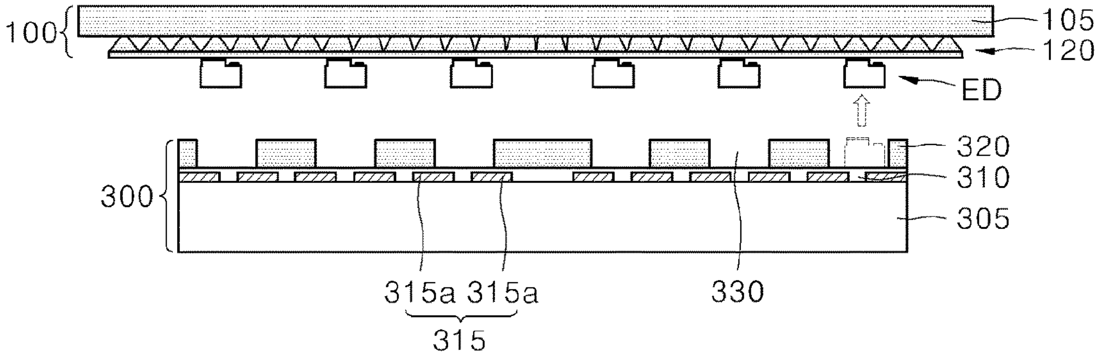

Referring to FIG. 8, the stamp donor plate 100 is disposed on the self-assembly donor plate 300 on which the plurality of light-emitting elements ED are arranged. The stamp donor plate 100 may include the stamp donor plate substrate 105 and the stamp structure 120 disposed on the stamp donor plate substrate 105.

Subsequently, the first transfer process is performed in which the plurality of light-emitting elements ED arranged on the self-assembly donor plate 300 are transferred onto the stamp donor plate 100 in a stamping manner. The first transfer process may include moving and bonding the stamp donor plate 100 toward and to the self-assembly donor plate 300, and transferring the plurality of light-emitting elements ED to the stamp donor plate 100, and then detaching the stamp donor plate 100 from the self-assembly donor plate 300.

The process of bonding the stamp donor plate 100 to the self-assembly donor plate 300 may be performed while one surface of the stamp structure 120 of the stamp donor plate 100 vertically faces the self-assembly donor plate 300. Furthermore, the process of detaching the stamp donor plate 100 from the self-assembly donor plate 300 may be carried out by minimizing a contact area between one surface of the stamp structure 120 of the stamp donor plate 100 and the self-assembly donor plate 300. Accordingly, tilt defects or flip defects that may occur when the light-emitting element ED is transferred to the stamp donor plate 100 may be reduced. Tilt defects or flip defects may occur when the adhesion strength of the contact area between the upper surface of the stamp structure 120 of the stamp donor plate 100 and the self-assembly donor plate 300 is not sufficiently low during the detachment process.

For this reason, the stamp structure 120 of the stamp donor plate 100 according to the aspect of the present disclosure may include a structure to reduce the strength of adhesion thereof to the self-assembly donor plate 300 and secure flow of air. For example, the stamp structure 120 may include a structure in which the plurality of protrusions 115*a* and 115*b* are arranged along one direction and are disposed on the stamp donor plate substrate 105, as shown in FIG. 1 and FIG. 2. The lower surfaces of adjacent ones of the plurality of protrusions 115*a* and 115*b* may be in contact with each other while there is no spacing therebetween. Accordingly, in a bottom view, the stamp donor plate 100 may have a flat surface shape. Each of the plurality of air flow passages 125*a* and 125*b* may be defined between neighboring ones of the protrusions 115*a* and 115*b*. The plurality of air flow passages 125*a* and 125*b* may be arranged in a direction parallel to the direction in which the stamp donor plate 100 is detached.

Figure 9:
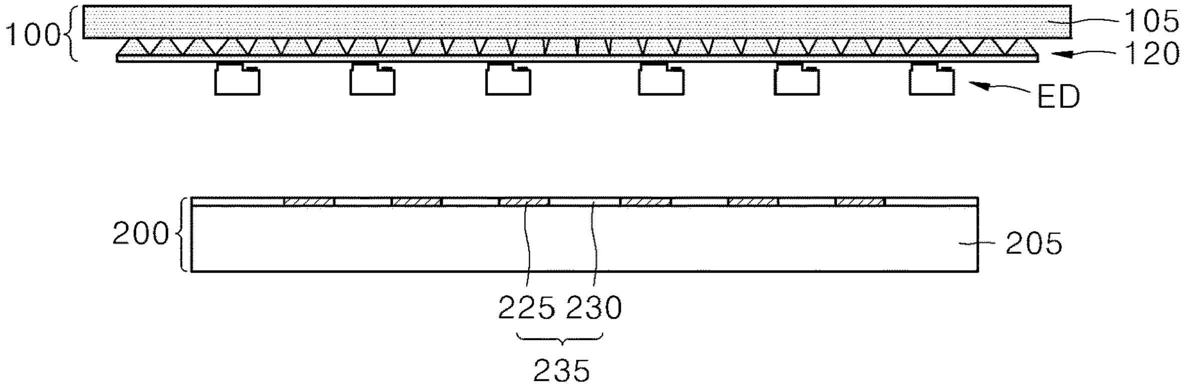

Referring to FIG. 9, the stamp donor plate 100 on which the plurality of light-emitting elements ED have been disposed is placed on the panel substrate 200. The adhesive layer 235 is disposed on the panel substrate 200. The adhesive layer 235 may include the first adhesive pattern 225 and the second adhesive pattern 230. The first adhesive patterns 225 and the second adhesive patterns 230 may be arranged alternately with each other. However, the present disclosure is not limited thereto.

The first adhesive pattern 225 may include a material having relatively stronger adhesiveness than that of the second adhesive pattern 230. Accordingly, the light-emitting elements may then be fixed and positioned onto the first adhesive pattern 225.

Figure 10:
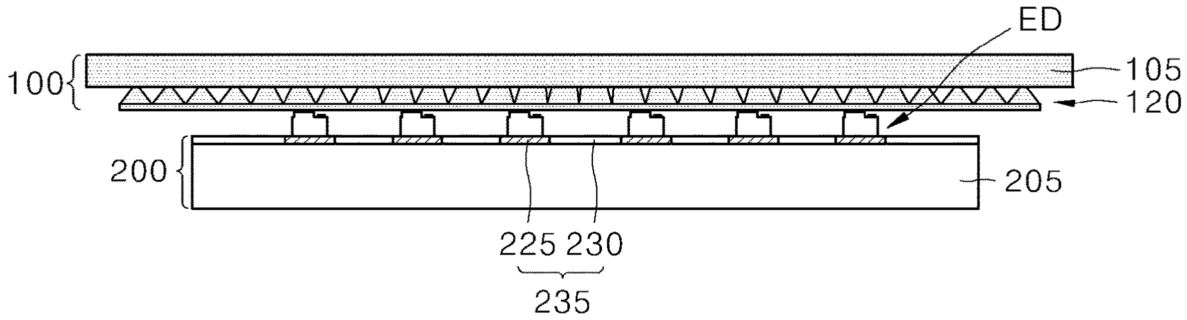
Figure 11:
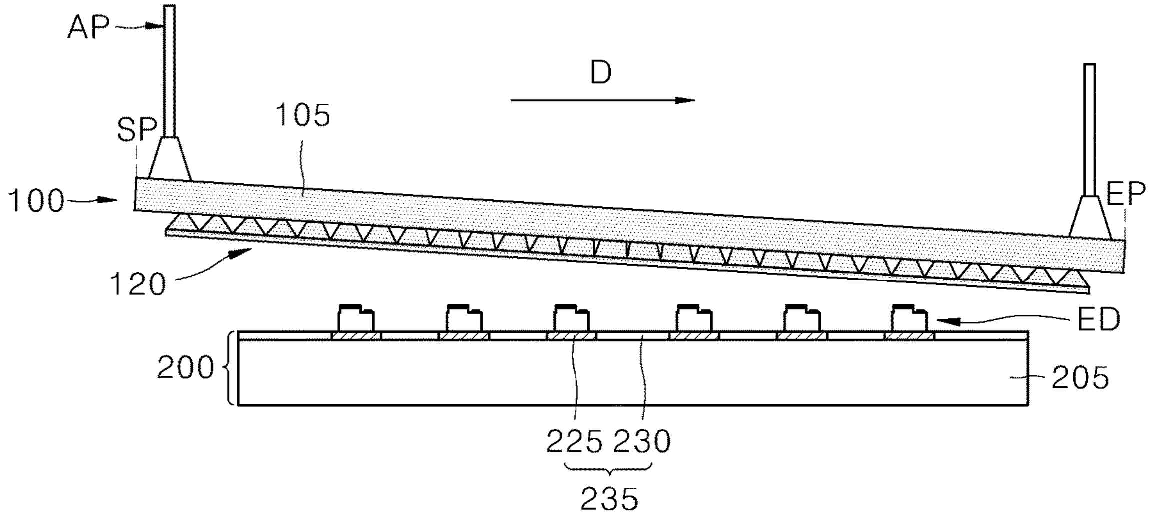

Referring to FIG. 10 and FIG. 11, a second transfer process is performed to transfer the plurality of light-emitting elements ED arranged on the stamp donor plate 100 onto the panel substrate 200 using a stamping manner. The second transfer process may include moving the stamp donor plate 100 toward the panel substrate 200 and contacting and bonding the light-emitting elements ED arranged on the stamp donor plate 100 with and to the adhesive layer 235 on the panel substrate 200, and detaching the stamp donor plate 100 from the panel substrate 200.

First, referring to FIG. 10, the stamp donor plate 100 is bonded to the panel substrate 200 through a stamping manner. The process of bonding the stamp donor plate 100 to the panel substrate 200 may be performed by moving the stamp donor plate 100 toward the panel substrate 200 while the upper surface of the panel substrate 200 faces vertically one surface of the stamp structure 120 of the stamp donor plate 100.

When the stamp donor plate 100 contacts the panel substrate 200, the light-emitting element ED is disposed on the first adhesive pattern 225 on the panel substrate 200. As the second adhesive pattern 230 has relatively weaker adhesiveness than that of the first adhesive pattern 225, the transfer may not be achieved when the light-emitting element ED contacts the second adhesive pattern 230. Accordingly, the light-emitting element ED may be transferred onto the first adhesive pattern 225 having the adhesion force capable of fixing the light-emitting element ED thereto. As a result, defects in which the light-emitting element ED is erroneously transferred to a non-target location on the panel substrate 200 or is not transferred to the target location may be prevented.

Next, referring to FIG. 11, a detachment process is performed to detach the stamp donor plate 100 from the panel substrate 200 using a detachment mechanism AP.

The detachment mechanism AP may be located on each of both opposing edges of the stamp donor plate 100. The detachment process may start at one side of the stamp donor plate 100 connected to the detachment mechanism AP located at a detachment start point SP and then proceed sequentially in a direction D toward the other side of the stamp donor plate 100 connected to the detachment mechanism AP located at a detachment end point EP.

Instead of performing the detachment process sequentially in a direction from one side of the stamp donor plate 100 to the other side thereof, the detachment process may be performed simultaneously across an entire area while the stamp donor plate 100 and the panel substrate 200 are in surface contact with each other. In this case, transfer defects may occur. For example, during the simultaneous detachment process of the entire area, the flip defect may occur in which the light-emitting element ED flips over, or the tilt defect in which the light-emitting element is tilted may occur. Such flip or tilt defects may occur when the adhesion strength between the stamp donor plate 100 and the panel substrate 200 is not reduced.

Accordingly, in accordance with an aspect of the present disclosure, the adhesion strength between the stamp donor plate 100 and the panel substrate 200 may be reduced by sequentially performing the detachment process in a direction from one side of the stamp donor plate 100 to the other side thereof, thereby preventing the flip defects and tilt defects.

Furthermore, the stamp structure 120 disposed on the stamp donor plate substrate 105 according to the aspect of the present disclosure may include the plurality of protrusions 115*a* and 115*b*. The lower surfaces of neighboring ones of the protrusions 115*a* and 115*b* may be in contact with each other while there is no spacing therebetween. Accordingly, each of the plurality of air flow passages 125*a* and 125*b* may be defined between neighboring ones of the protrusions 115*a* and 115*b*. The air flow passages 125*a* and 125*b* may include the first air flow passage 125*a* disposed in the inner area AA of the stamp donor plate substrate 105 and the second air flow passage 125*b* disposed in the outer area DMA thereof. In this regard, the width of the first air flow passage 125*a* disposed in the inner area AA of the stamp donor plate substrate 105 and the width of the second air flow passage 125*b* disposed in the outer area DMA thereof may be different from each other.

Accordingly, in the detachment process of the transfer process, the air inflow into the second air flow passages 125*b* arranged in the outer area DMA of the stamp donor plate substrate 105 may be larger than the air inflow into the first air flow passages 125*a* arranged in the inner arca AA thereof. Thus, the detachment may occur first in the outer area DMA of the stamp donor plate substrate 105. As a result, the detachment may be achieved with uniform pressure in both the inner area AA and the outer area DMA of the stamp donor plate 100, thereby preventing transfer defects in the light-emitting element, and thus improving process reliability.

Figure 12:
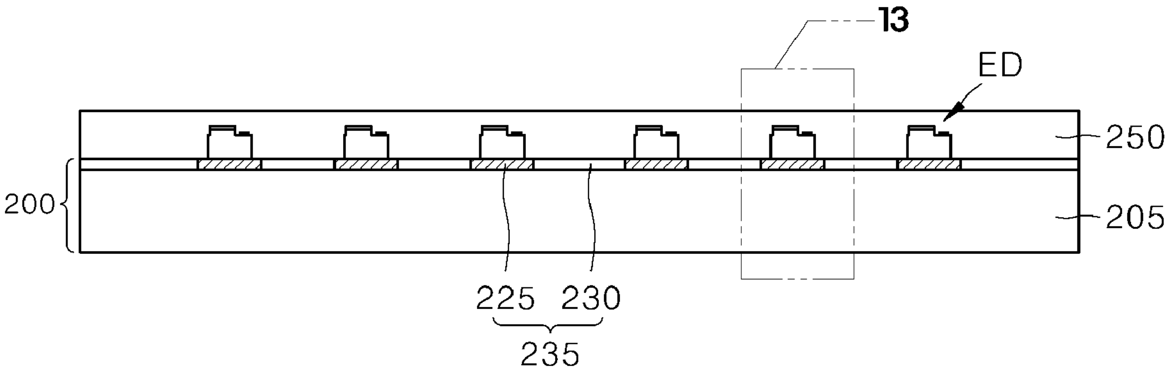
Figure 13:
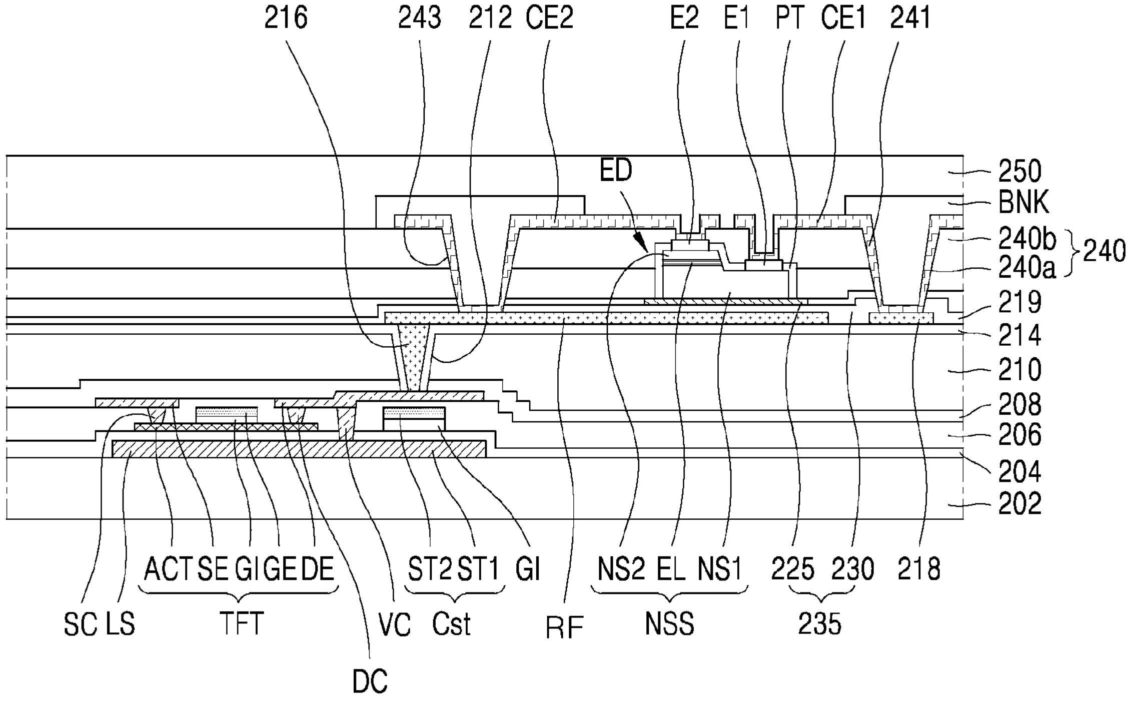

Referring to FIG. 12 and FIG. 13, follow-up processes may be performed as follows: a wiring electrode is formed on the light-emitting element ED disposed on the panel substrate 200, and a sealing protection layer 250 is formed to cover the light-emitting element ED. In this way, a display device may be manufactured. FIG. 13 is an enlarged cross-sectional view of an arca 13 in FIG. 12.

The light-emitting element ED disposed on the first adhesive pattern 225 may include the nitride semiconductor structure NSS, the first electrode E1, and the second electrode E2. The nitride semiconductor structure NSS may include the first semiconductor layer NS1, the active layer EL disposed on one side of the upper surface of the first semiconductor layer NS1, and the second semiconductor layer NS2. The first electrode E1 is disposed on the other side of the upper surface of the first semiconductor layer NS1 where the active layer EL is not located, and the second electrode E2 is disposed on the second semiconductor layer NS2. The protective layer pattern PT may cover a portion of the outer surface of the light-emitting element ED.

The light-emitting element ED may be covered with the upper planarization layer 240. The upper planarization layer 240 may have a sufficient thickness to planarize the upper surface having steps due to the underlying circuit elements. The upper planarization layer 240 may include a structure in which a second planarization layer 240*a* and a third planarization layer 240*b* are stacked. The upper planarization layer 240 may include opening holes 241 and 243 that respectively expose portions of surfaces of the reflective electrode RF and the signal line 218. The opening holes 241 and 243 may include the first opening hole 241 extending through the upper planarization layer 240 and the second adhesive pattern 230 to expose the portion of the surface of the signal line 218, and the second opening hole 243 extending through the upper planarization layer 240 and the second adhesive pattern 230 to expose the portion of the surface of the reflective electrode RF.

Furthermore, the second planarization layer 240*a* may not cover a portion of the upper surface of each of the first electrode E1 and the second electrode E2 of the light-emitting element ED to be exposed. The first electrode E1 and the second electrode E2 may be electrically connected to a first wiring electrode CE1 and a second wiring electrode CE2, respectively.

The first wiring electrode CE1 may extend to the exposed surface of the first opening hole 241, and the second wiring electrode CE2 may extend to the exposed surface of the second opening hole 243. The first wiring electrode CE1 may be electrically connected to the signal line 218. The second wiring electrode CE2 may be electrically connected to the drain electrode DE via the reflective electrode RF.

The first wiring electrode CE1 and the second wiring electrode CE2 may be disposed in the same layer and made of the same conductive material. In one example, each of the first wiring electrode CE1 and the second wiring electrode CE2 may include a transparent metal oxide such as indium-tin-oxide (ITO) and indium-zinc-oxide (IZO).

A bank BNK may be disposed on the upper planarization layer 240. The bank BNK may include an opaque material. However, the present disclosure is not limited thereto. The first opening hole 241 and the second opening hole 243 may be filled with the material constituting the bank BNK. Furthermore, the bank BNK may be disposed in a surrounding area around the light-emitting element ED. A protective layer 250 may be disposed on the upper planarization layer 240 including the bank BNK. The protective layer 250 may prevent impurities from invading the light-emitting element ED.

According to an aspect of the present disclosure, the stamp donor plate comprising: a stamp donor plate substrate including an inner area and an outer area surrounding the inner area; and a stamp structure disposed on the stamp donor plate substrate, wherein the stamp structure includes a plurality of protrusions, wherein the plurality of protrusions include a plurality of first protrusions arranged on an inner arca, and a plurality of second protrusions arranged on the outer arca.

Further, according to an aspect of the present disclosure, wherein each of the plurality of protrusions has a first surface in contact with the stamp donor plate substrate and a second surface opposite to the first surface, wherein a width of the second surface is larger than a width of the first surface, wherein the second surfaces of the protrusions adjacent to each other contact each other at a boundary therebetween.

Further, according to an aspect of the present disclosure, wherein lower surfaces of the plurality of first protrusions of the stamp structure constitute one flat surface.

Further, according to an aspect of the present disclosure, wherein each of the first protrusion and the second protrusion has a trapezoidal cross-section.

Further, according to an aspect of the present disclosure, further comprising a first air flow passage defined between adjacent ones of the plurality of first protrusions, and a second air flow passage defined between adjacent ones of the plurality of second protrusions.

Further, according to an aspect of the present disclosure, wherein the first air flow passage and the second air flow passage have different widths, wherein the second air flow passage has a relatively larger width than a width of the first air flow passage.

Further, according to an aspect of the present disclosure, wherein each of the plurality of protrusions includes a first surface in contact with the stamp donor plate substrate and a second surface opposite the first surface, wherein the stamp donor plate includes an air flow lane defined on the second surface.

Further, according to an aspect of the present disclosure, wherein the air flow lane has a V-shaped groove extending along one direction of the stamp donor plate substrate.

Further, according to an aspect of the present disclosure, wherein the air flow lane has a width smaller than a width of the light-emitting element.

According to some implementations of the present disclosure, the method for manufacturing a display device, the method comprising: preparing a panel substrate including an adhesive layer; providing a stamp donor plate comprising: a stamp donor plate substrate including an inner area and an outer area surrounding the inner arca; and a stamp structure disposed on the stamp donor plate substrate, wherein the stamp structure includes a plurality of protrusions, wherein the plurality of protrusions include a plurality of first protrusions arranged on an inner area, and a plurality of second protrusions arranged on the outer area; arranging a plurality of light-emitting elements on the stamp donor plate; positioning the stamp donor plate having the plurality of light-emitting elements arranged thereon on the panel substrate; moving the stamp donor plate toward the panel substrate and bonding the light-emitting elements onto the adhesive layer of the panel substrate; and detaching the stamp donor plate from the panel substrate.

Further, according to an aspect of the present disclosure, wherein detaching the stamp donor plate from the panel substrate includes: placing a detachment mechanism on each of both opposing edges of the stamp donor plate; and detaching the stamp donor plate from the panel substrate using the detachment mechanism such that detachment starts at one side of the stamp donor plate connected to the detachment mechanism located at a detachment start point and proceeds sequentially toward the other side of the stamp donor plate connected to the detachment mechanism located at a detachment end point.

Further, according to an aspect of the present disclosure, wherein the stamp donor plate further includes a first air flow passage defined between adjacent ones of the plurality of first protrusions, and a second air flow passage defined between adjacent ones of the plurality of second protrusions.

Further, according to an aspect of the present disclosure, wherein air inflow into the second air flow passage disposed in the outer area of the stamp donor plate substrate is greater than air inflow into the first air flow passage disposed in the inner area, such that the detachment starts first in the outer area of the stamp donor plate substrate.

Although the aspects of the present disclosure have been described in more detail with reference to the accompanying drawings, the present disclosure is not necessarily limited to these aspects, and may be modified in a various manner within the scope of the technical spirit of the present disclosure. Accordingly, the aspects as disclosed in the present disclosure are intended to describe rather than limit the technical idea of the present disclosure, and the scope of the technical idea of the present disclosure is not limited by these aspects. Therefore, it should be understood that the aspects described above are not restrictive but illustrative in all respects. Thus, it is intended that the present disclosure covers the modifications and variations of the aspects provided they come within the scope of the appended claims and their equivalents.

What is claimed is:

1. A stamp donor plate comprising:
- a stamp donor plate substrate including an inner area and an outer area surrounding the inner area; and
- a stamp structure disposed on the stamp donor plate substrate,
- wherein the stamp structure includes a plurality of protrusions including a plurality of first protrusions arranged on the inner area and a plurality of second protrusions arranged on the outer area,
- wherein each of the plurality of protrusions has a first surface in contact with the stamp donor plate substrate and a second surface opposite to the first surface,
- wherein a width of the second surface is larger than a width of the first surface, and
- wherein the second surface of the protrusions adjacent to each other contact each other at a boundary therebetween.

2. The stamp donor plate of claim 1, wherein the second surface of the plurality of first protrusions of the stamp structure constitute one flat surface.

3. The stamp donor plate of claim 1, wherein each of the first protrusion and the second protrusion has a trapezoidal cross-section.

4. The stamp donor plate of claim 1, further comprising:
- a first air flow passage defined between adjacent ones of the plurality of first protrusions; and
- a second air flow passage defined between adjacent ones of the plurality of second protrusions.

5. The stamp donor plate of claim 4, wherein the first air flow passage and the second air flow passage have different widths, and
- wherein the second air flow passage has a width larger than a width of the first air flow passage.

6. The stamp donor plate of claim 1, wherein each of the plurality of protrusions includes a first surface in contact with the stamp donor plate substrate and a second surface opposite the first surface, and
- wherein the stamp donor plate includes an air flow lane defined on the second surface.

7. The stamp donor plate of claim 6, wherein the air flow lane has a V-shaped groove extending along one direction of the stamp donor plate substrate.

8. The stamp donor plate of claim 6, wherein the air flow lane has a width smaller than a width of the light-emitting element.

9. A stamp donor plate comprising:
- a stamp donor plate substrate including an inner area and an outer area surrounding the inner area; and
- a stamp structure disposed on the stamp donor plate substrate,
- wherein the stamp donor plate includes an inner area and an outer area,
- wherein the stamp structure includes a plurality of first protrusions arranged on the inner area and a plurality of second protrusions arranged on the outer area,
- wherein the plurality of first protrusions and the plurality of second protrusions are disposed on the same surface of the stamp donor plate substrate,
- wherein lower surfaces of adjacent first protrusions contact each other, and lower surfaces of adjacent second protrusions contact each other,
- wherein a first air flow passage is formed between opposing surfaces of adjacent ones of the plurality of first protrusions, and a second air flow passage is formed between opposing surfaces of adjacent ones of the plurality of second protrusions, and wherein a cross-sectional area of the second air flow passage is larger than a cross-sectional area of the first air flow passage.

10. The stamp donor plate of claim 9, wherein each of the plurality of protrusions has a first surface in contact with the stamp donor plate substrate and a second surface opposite to the first surface.

11. The stamp donor plate of claim 10, wherein each of the first protrusion and the second protrusion has a trapezoidal cross-section.

12. The stamp donor plate of claim 10, wherein the stamp donor plate includes an air flow lane defined on the second surface.

13. The stamp donor plate of claim 9, wherein the air flow lane has a V-shaped groove extending along one direction of the stamp donor plate substrate.

* * * * *